(12) United States Patent
Dishongh et al.

(10) Patent No.: US 6,752,204 B2
(45) Date of Patent: Jun. 22, 2004

(54) IODINE-CONTAINING THERMAL INTERFACE MATERIAL

(75) Inventors: Terrance J. Dishongh, Hillsboro, OR (US); Prateek J. Dujari, Portland, OR (US); Bin Lian, Hillsboro, OR (US); Damion Searls, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/957,702

(22) Filed: Sep. 18, 2001

(65) Prior Publication Data

US 2003/0051868 A1 Mar. 20, 2003

(51) Int. Cl.[7] .............................. F28F 7/00; H05K 7/20
(52) U.S. Cl. ........................ 165/185; 361/704; 165/80.3
(58) Field of Search ................ 165/185, 80.3, 165/135; 361/704, 708; 257/706

(56) References Cited

U.S. PATENT DOCUMENTS

| | | | | |
|---|---|---|---|---|
| 4,092,697 A | * | 5/1978 | Spaight | 165/185 |
| 5,094,769 A | * | 3/1992 | Anderson, Jr. et al. | 252/572 |
| 5,168,926 A | * | 12/1992 | Watson et al. | 165/185 |
| 5,441,918 A | * | 8/1995 | Morisaki et al. | 437/209 |
| 5,587,882 A | * | 12/1996 | Patel | 361/705 |
| 5,623,394 A | * | 4/1997 | Sherif et al. | 361/705 |
| 5,844,309 A | * | 12/1998 | Takigawa et al. | 257/701 |
| 5,985,697 A | * | 11/1999 | Chaney et al. | 438/122 |
| 5,990,552 A | * | 11/1999 | Xie et al. | 257/718 |
| 6,229,703 B1 | * | 5/2001 | Lee | 361/704 |
| 6,281,573 B1 | * | 8/2001 | Atwood et al. | 257/706 |

* cited by examiner

*Primary Examiner*—Henry Bennett
*Assistant Examiner*—Tho V Duong
(74) *Attorney, Agent, or Firm*—Robert G. Winkle

(57) ABSTRACT

An iodine-containing thermal interface material disposed between a heat source and a heat dissipation device.

20 Claims, 5 Drawing Sheets

IODINE-CONTAINING THERMAL INTERFACE MATERIAL

BACKGROUND OF THE INVENTION

1. Field of the Invention

The present invention relates to apparatus and methods for removal of heat from electronic devices. In particular, the present invention relates to a thermal interface comprising an iodine-containing material.

2. State of the Art

Higher performance, lower cost, increased miniaturization of integrated circuit components, and greater packaging density of integrated circuits are ongoing goals of the microelectronic industry. As these goals are achieved, microelectronic dice become smaller. Accordingly, the density of power consumption of the integrated circuit components in the microelectronic device has increased, which, in turn, increases the average junction temperature of the microelectronic device. If the temperature of the microelectronic device becomes too high, the integrated circuits of the microelectronic device may be damaged or destroyed.

Various apparatus and techniques have been used and are presently being used for removing heat from microelectronic devices. One such heat dissipation technique involves the attachment of a heat dissipation device to a microelectronic device. FIG. 4 illustrates an assembly 200 comprising a microelectronic device 202 (illustrated as a flip chip) physically and electrically attached to a carrier substrate 204 by a plurality of solder balls 206. A back surface 216 of a heat dissipation device 208 may be attached to a back surface 212 of the microelectronic device 202 by a thermally conductive adhesive or solder 214. The heat dissipation device 208 may be a heat pipe, as known in the art, or a heat slug constructed from a thermally conductive material, such as copper, copper alloys, aluminum, aluminum alloys, and the like.

However, the use of a rigid thermally conductive adhesive or solder 214 can cause stresses in the microelectronic device 202 due to a mismatch between coefficients of thermal expansion ("CTE") of the heat dissipation device 208 and the microelectronic device 202 as the microelectronic device 202 heats to a normal operating temperature when on and room temperature when off. Stresses due to CTE mismatch increase the probability that cracks will initiate and propagate in the microelectronic device 202, which may cause the failure of the microelectronic device 202. Furthermore, in order to get the solder materials to adhere to the microelectronic device back surface 212 and the heat dissipation device back surface 216, a gold coating may have to be applied to both surfaces, which is prohibitively expensive.

In another known embodiment as shown in FIG. 5, a pin grid array-type ("PGA") microelectronic device 222 is placed in a socket 224 mounted on the carrier substrate 204, wherein pins 226 extending from the PGA device 222 make electrical contact with conductive vias 228 in the socket 224. The socket 224 is, in turn, in electrical contact (not shown) with the carrier substrate 204. The heat dissipation device 208 (shown as a finned heat sink having a plurality of fins 232) is kept in contact with the PGA device 222 with a spring clip 234 that spans the heat dissipation device 208 and connects to the socket 224. A conductive grease 236 is placed between the microelectronic device 202 and the heat dissipation device 208. This configuration virtually eliminates problems with CTE mismatch. Such materials that are placed between heat dissipation devices and microelectronic devices are generally known as thermal interface materials.

It is also known that the conductive grease 236 of FIG. 5 may be replaced with a phase-change material or matrix. Such materials are in a substantially solid phase (paste-like consistency) when cool (i.e., room temperature). When heated (brought to operating temperatures), the phase-change material changes to a substantially liquid phase (grease-like consistency), which allows the phase-change material to conform to surface irregularites of mating surfaces (when in a solid phase is not able to conform to all microwarpages). Therefore, the liquid phase has better contact properties that result in a higher heat dissipation compared to the solid phase.

However, as the size or "footprint" of microelectronic devices decreases, the contact area between the microelectronic device and the heat dissipation device decreases, which reduces the area available for conductive heat transfer. Thus, with a decrease of the size in the microelectronic device, heat dissipation from the heat dissipation device becomes less efficient. Furthermore, as the microelectronic device power is increased, the heat source upper temperature specifications decreases, or the external ambient temperature specification increases. Thus, every area of thermal performance must be examined for any possible enhancement. One such area is the thermal interface material between the microelectronic device and the heat dissipation device. As microelectronic devices become smaller, the heat transfer properties of the thermal interface materials become a greater factor. Thus, currently available thermal interface materials, such as thermally conductive adhesives, greases, and most phase-change materials, are quickly becoming bottlenecks to heat dissipation.

Therefore, it would be advantageous to develop a thermal interface material, as well as apparatus and methods using the same, to improve the efficiency of heat transfer at an interface between a heat source and a heat dissipation device.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
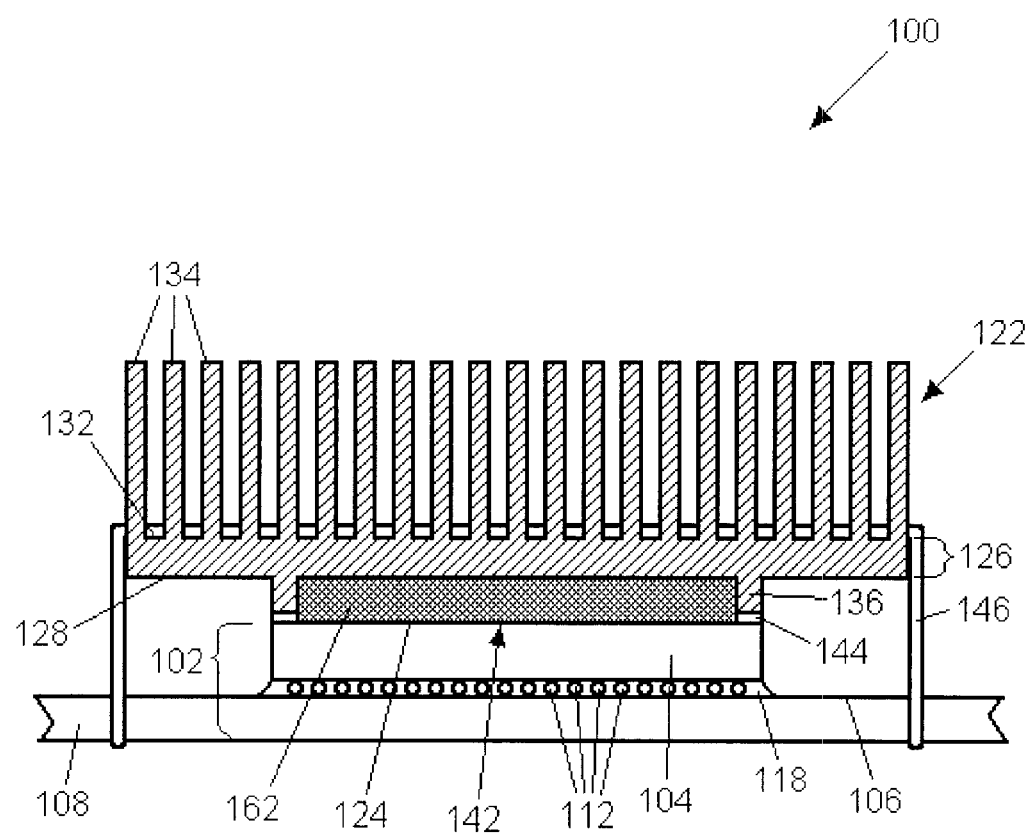
FIG. 1 is a side cross-sectional view of one embodiment of a microelectronic assembly, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Although the present invention is described in terms of microelectronic devices and microelectronic-type heat dissipation devices, it is not so limited. The present invention may be used as an interface between any applicable heat source and any heat dissipation mechanism.

FIG. 1 illustrates a microelectronic assembly 100 according to one embodiment of the present invention. The microelectronic assembly 100 includes a microelectronic device package 102 comprising a microelectronic device 104 (such as a microprocessor, a chipset, and the like) attached to and in electrical contact with a first surface 106 of a substrate 108. The attachment and electrical contact is achieved through a plurality of interconnectors, such as solder balls 112, extending between contacts (not shown) on the microelectronic device 104 and contacts (not shown) on the substrate first surface 106. An underfill material 118 may be disposed between the microelectronic device 104 and the substrate 108. The substrate 108 may be an interposer substrate (e.g., used in OLGA, FCBGA, FCPGA, etc.), a motherboard, a daughter card, or any other such supporting structure for the microelectronic device 104, as will be evident to one skilled in the art.

A heat dissipation device 122 is placed in thermal contact with a first surface 124 of the microelectronic device 104. The heat dissipation device 122 comprises a base portion 126 having a contact surface 128 and a dissipation surface 132 with a plurality of projections 134 extending therefrom. The projections 134 may be fins, columns, or any such high surface area structures in any configuration that will be evident to one skilled in the art. The heat dissipation device 122 is preferably made from a highly thermally conductive material, including but no limited to copper, copper alloy, aluminum alloys, and the like.

The heat dissipation device base portion 126 may include an offset 136, such as a flange extending from the heat dissipation device contact surface 128. The offset 136 is preferably configured to contact the microelectronic device 104 proximate a perimeter thereof such that a chamber 142 is formed between the heat dissipation device contact surface 128 and the microelectronic device first surface 124.

The heat dissipation device offset 136 is preferably attached to the heat dissipation device contact surface 128 with a thermally conductive adhesive 144, such as silicones, filled epoxies, acrylics, and the like. To ensure adequate attachment of the heat dissipation device 122 to the microelectronic device 104, a clip 146 may also be provided to extend across the dissipation surface 132 and attached to the substrate 108.

Figure 2:
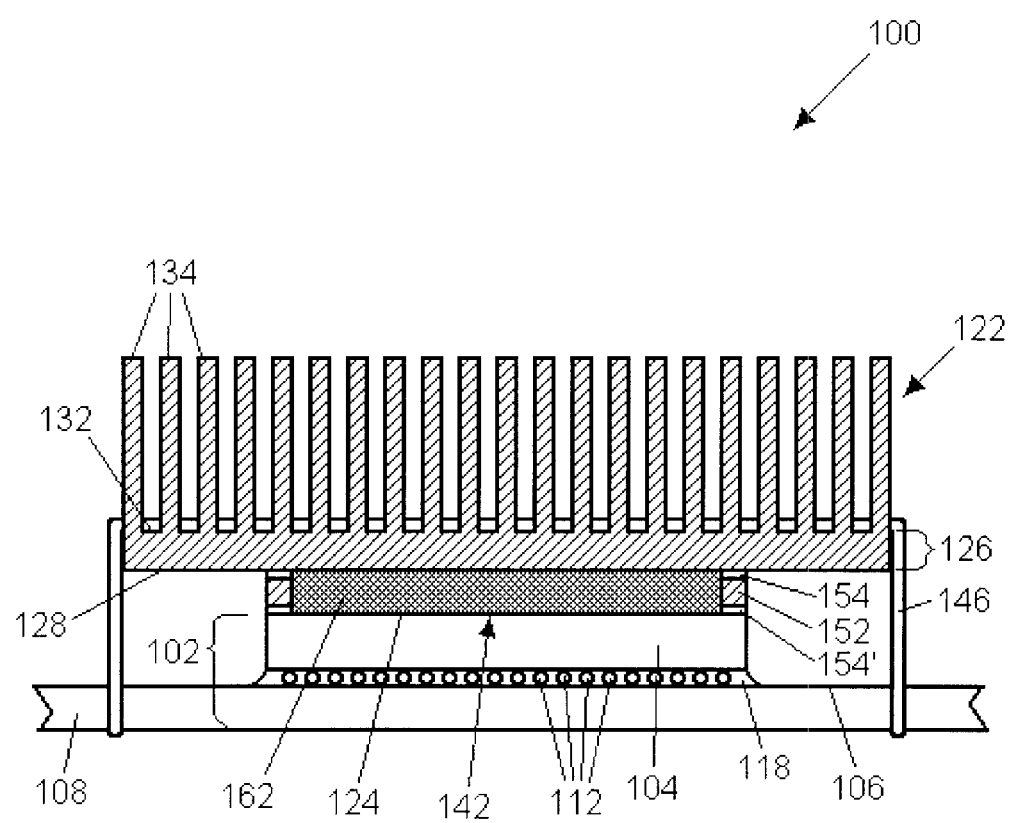
FIG. 2 is a side cross-sectional view of another embodiment of a microelectronic assembly, according to the present invention.
Figure 3:
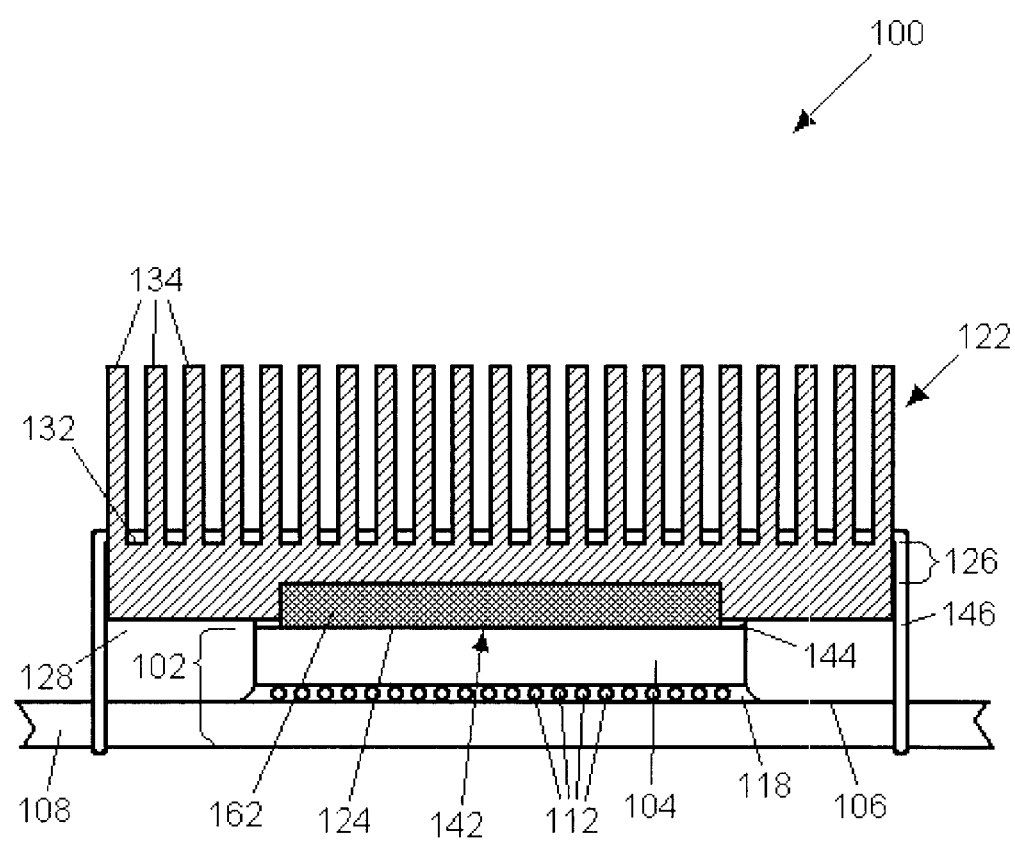
FIG. 3 is a side cross-sectional view of yet another embodiment of a microelectronic assembly, according to the present invention.
Figure 4:
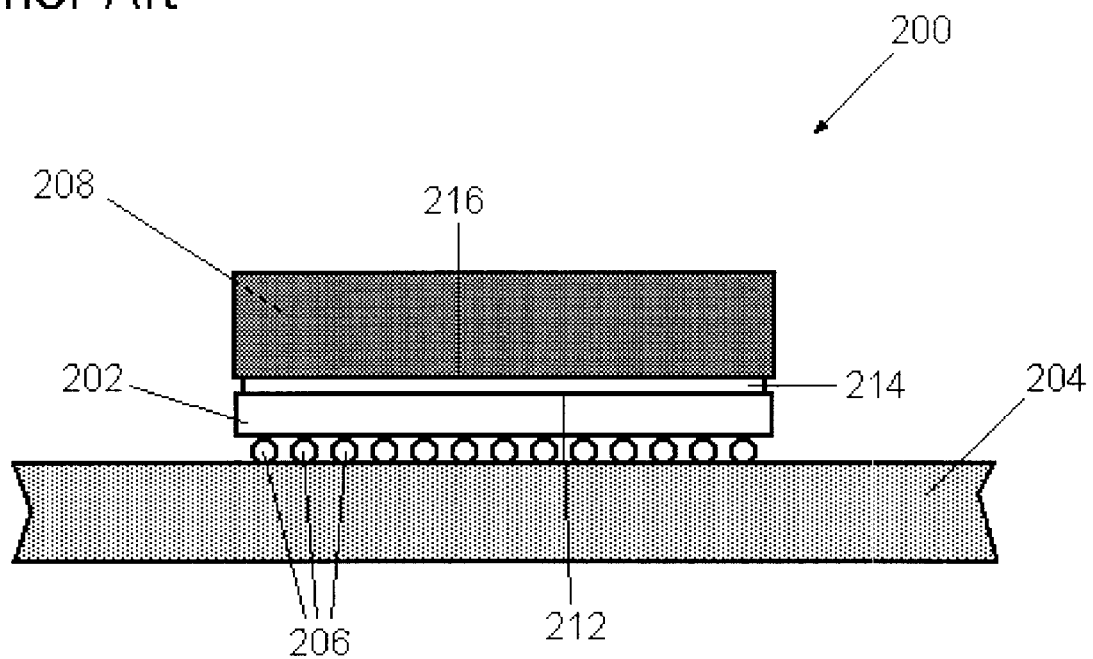
FIG. 4 is a side cross-sectional view of a heat dissipation device attached to microelectronic device, as known in the art.
Figure 5:
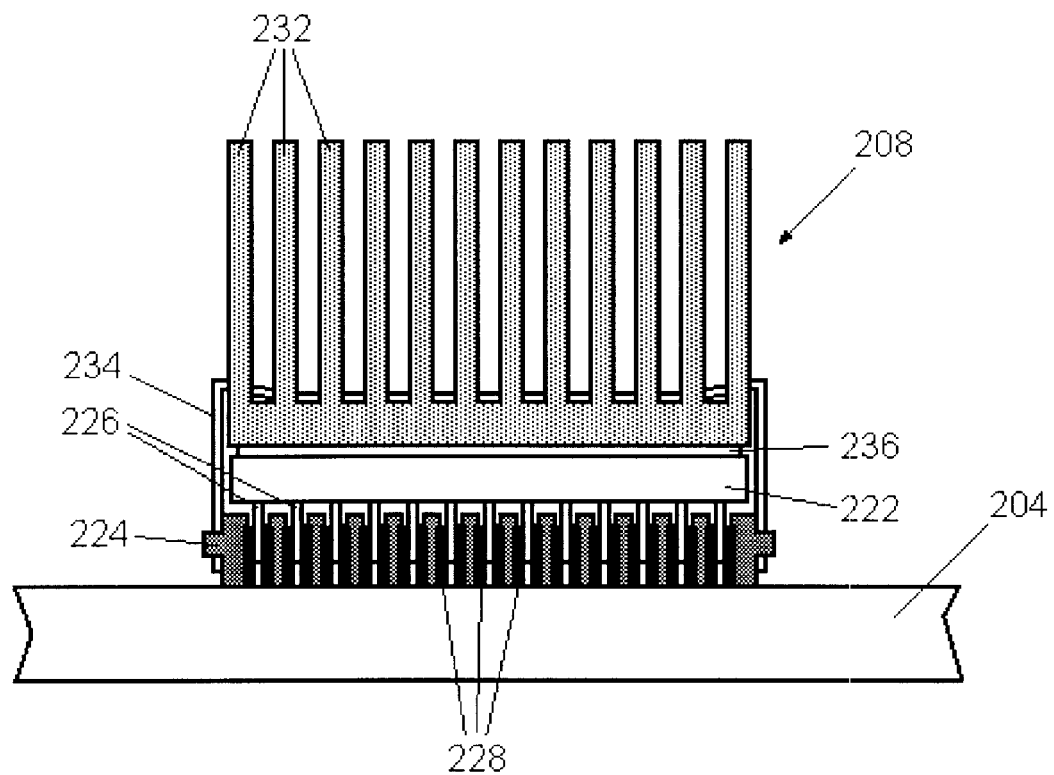
FIG. 5 is a side cross-sectional view of a heat dissipation device clipped to PGA microelectronic device, as known in the art.

It is also understood that the offset may be an independent structure, such as a gasket or spacer 152, as shown in FIG. 2. The spacer 152, preferably conforming to the perimeter of the microelectronic device 104, may be attached to the heat dissipation device contact surface 128 and the microelectronic device backside surface 124 with thermally conductive adhesive 154 and 154', respectively. Furthermore, the chamber 142 may be defined by forming a recess, preferably conforming to the perimeter of the microelectronic device 104, in the heat dissipation device base portion 126, as shown in FIG. 3. The microelectronic device first surface 124 is attached to the heat dissipation device contact surface 128 over the recess such that the chamber 142 is defined.

In the present invention, an iodine-containing thermal interface material 162 is disposed within and, preferably, substantially filling the chamber 142. At room temperature (i.e., approximately 22° C.), iodine is a black, solid non-metal material. Iodine has a thermal conductivity of about 4.49 W/mK, which is comparable to conventional thermal interface materials (about 4 W/mK), such as Melcar Thermal Grease® TE-001™, TE-002™, Card Chemical Product Thermoset® 110™, MD-120™, and Card Chemical Products Gelease™. Iodine also has a relatively low melting point (about 113.5° C.), which is lower than the junction temperatures of the integrated circuits of many current microelectronic devices (such as microprocessors and chipsets). Additionally, since iodine is a stable, relatively inert, non-combustible, and less reactive than all other halogens, it is a very viable option as a thermal interface material.

In the present invention, the iodine-containing thermal interface material 162 enhances the performance of a heat dissipation device 122 by withdrawing the latent heat from the microelectronic device 104 at temperatures close to junction temperatures, in addition to providing a heat conduction path away from the microelectronic device 104. When the microelectronic device 104 is powered up, it generates heat, raising its temperature. Thus, when the temperature of the microelectronic device 104 is increased above the melting temperature of the iodine-containing thermal interface material 162, the iodine-containing thermal interface material 106 undergoes a phase change from a solid to a liquid state. The chamber 142 serves to contain the liquid iodine-containing material 162. When the temperature falls below about 113° C., the iodine-containing thermal interface material 162 resolidifies.

It is, of course, understood that although the above discussion relates to the use of pure iodine as the iodine-containing thermal interface material 162, other materials may be added to either lower or raise the melting temperature of the iodine-containing thermal interface material, as will be evidence to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An assembly, comprising:
   a heat source having a first surface;
   a heat dissipation device having a base portion including a dissipation surface and a contact surface;
   a chamber defined between said heat source and said heat dissipation device; and
   an iodine-containing thermal interface material disposed within said chamber.

2. The assembly of claim 1, wherein said chamber is defined by an offset extending from said heat dissipation device contact surface.

3. The assembly of claim 1, wherein said chamber is defined by an spacer between said heat dissipation device contact surface.

4. The assembly of claim 1, wherein said chamber is defined by a recess extending into said heat dissipation device base portion.

5. The microelectronic assembly of claim 1, wherein said heat dissipation device further includes a plurality of projections extending from said dissipation surface.

6. A microelectronic assembly, comprising:

a microelectronic device having a backside surface;

a heat dissipation device having a base portion including a dissipation surface and a contact surface, wherein said base portion includes an offset extending from said contact surface;

said offset attached to said microelectronic device backside surface defining a chamber; and an iodine-containing thermal interface material disposed within said chamber.

7. The microelectronic assembly of claim 6, wherein said offset conforms to a perimeter of said microelectronic device.

8. The microelectronic assembly of claim 6, further including a layer of thermally conductive adhesive attaching said offset to said microelectronic device backside surface.

9. The microelectronic assembly of claim 6, wherein said microelectronic device is attached to a substrate, and further including a clip extending across said dissipation surface, wherein said clip attaches to said substrate.

10. The microelectronic assembly of claim 6, wherein said heat dissipation device further includes a plurality of projections extending from said dissipation surface.

11. A microelectronic assembly, comprising:

a microelectronic device having a backside surface;

a heat dissipation device having a base portion including a dissipation surface and a contact surface;

a spacer extending between said microelectronic device backside surface and said heat dissipation device contact surface defining a chamber; and an iodine-containing thermal interface material disposed within said chamber.

12. The microelectronic assembly of claim 11, wherein said spacer conforms to a perimeter of said microelectronic device.

13. The microelectronic assembly of claim 11, wherein said spacer is attached to said heat dissipation device contact and said microelectronic device backside surface with layers of thermally conductive adhesive material.

14. The microelectronic assembly of claim 11, wherein said microelectronic device is attached to a substrate, and further including a clip extending across said dissipation surface, wherein said clip attaches to said substrate.

15. The microelectronic assembly of claim 11, wherein said heat dissipation device further includes a plurality of projections extending from said dissipation surface.

16. A microelectronic assembly, comprising:

a microelectronic device having a backside surface;

a heat dissipation device having a base portion including a dissipation surface and a contact surface, wherein said base portion includes a recess formed therein from said contact surface, said microelectronic backside surface attached to said contact surface over said recess such that a chamber is defined; and an iodine-containing thermal interface material disposed within said chamber.

17. The microelectronic assembly of claim 16, wherein said recess conforms to a perimeter of said microelectronic device.

18. The microelectronic assembly of claim 16, wherein said spacer is attached to said heat dissipation device contact and said microelectronic device backside surface with layers of thermally conductive adhesive material.

19. The microelectronic assembly of claim 16, wherein said microelectronic device is attached to a substrate, and further including a clip extending across said dissipation surface, wherein said clip attaches to said substrate.

20. The microelectronic assembly of claim 16, wherein said heat dissipation device further includes a plurality of projections extending from said dissipation surface.

* * * * *

UNITED STATES PATENT AND TRADEMARK OFFICE
CERTIFICATE OF CORRECTION

PATENT NO. : 6,752,204 B2
DATED : June 22, 2004
INVENTOR(S) : Dishongh et al.

Page 1 of 1

It is certified that error appears in the above-identified patent and that said Letters Patent is hereby corrected as shown below:

<u>Column 4,</u>
Line 22, delete "110$^{TM}$" and insert -- MD-110$^{TM}$ --.

Signed and Sealed this

Seventh Day of September, 2004

JON W. DUDAS
*Director of the United States Patent and Trademark Office*